(12) United States Patent  (10) Patent No.: US 8,283,733 B2
Dong et al.  (45) Date of Patent: Oct. 9, 2012

(54) SEMICONDUCTOR DEVICES WITH GATE ELECTRODES AND WITH MONOCRYSTALLINE SILICON REGIONS THAT CONTAIN ATOMS OF NITROGEN AND ONE OR MORE OF CHLORINE, BROMINE, SULFUR, FLUORINE, OR PHOSPHORUS

(75) Inventors: Zhong Dong, Fremont, CA (US); Ching-Hwa Chen, Milpitas, CA (US)

(73) Assignee: Promos Technologies Pte. Ltd., Singapore (SG)

( * ) Notice: Subject to any disclaimer, the term of this patent is extended or adjusted under 35 U.S.C. 154(b) by 54 days.

(21) Appl. No.: 12/940,507

(22) Filed: Nov. 5, 2010

(65) Prior Publication Data
US 2011/0095344 A1  Apr. 28, 2011

Related U.S. Application Data

(62) Division of application No. 12/128,996, filed on May 29, 2008, now Pat. No. 7,851,339.

(51) Int. Cl.
*H01L 29/36* (2006.01)
*H01L 29/772* (2006.01)
(52) U.S. Cl. .............. 257/404; 257/612; 257/E29.27
(58) Field of Classification Search ........... 257/E21.137, 257/E21.145
See application file for complete search history.

(56) References Cited

U.S. PATENT DOCUMENTS

| | | | |
|---|---|---|---|
| 3,837,873 A | 9/1974 | Pollack et al. | |
| 4,102,715 A | 7/1978 | Kambara et al. | |
| 4,139,402 A | 2/1979 | Steinmaier et al. | |
| 4,236,948 A | 12/1980 | Seibold et al. | |
| 6,329,273 B1 | 12/2001 | Thurgate et al. | |
| 6,451,657 B1 * | 9/2002 | Gardner et al. | 438/299 |
| 2002/0197806 A1 | 12/2002 | Furukawa et al. | |
| 2004/0142518 A1 | 7/2004 | Yu et al. | |
| 2006/0244080 A1 * | 11/2006 | Chen et al. | 257/408 |
| 2009/0294806 A1 | 12/2009 | Dong et al. | |

* cited by examiner

*Primary Examiner* — Stephen W Smoot
(74) *Attorney, Agent, or Firm* — Michael Shenker; Haynes and Boone, LLP (57) ABSTRACT

Performance of field effect transistors and other channel dependent devices formed on a monocrystalline substrate is improved by carrying out a high temperature anneal in a nitrogen releasing atmosphere while the substrate is coated by a sacrificial oxide coating containing easily diffusible atoms that can form negatively charged ions and can diffuse deep into the substrate. In one embodiment, the easily diffusible atoms comprise at least 5% by atomic concentration of chlorine atoms in the sacrificial oxide coating and the nitrogen releasing atmosphere includes NO. The high temperature anneal is carried out for less than 10 hours at a temperature less than 1100° C.

23 Claims, 6 Drawing Sheets

SEMICONDUCTOR DEVICES WITH GATE ELECTRODES AND WITH MONOCRYSTALLINE SILICON REGIONS THAT CONTAIN ATOMS OF NITROGEN AND ONE OR MORE OF CHLORINE, BROMINE, SULFUR, FLUORINE, OR PHOSPHORUS

CROSS REFERENCE TO RELATED APPLICATION

The present application is a divisional application of U.S. patent application, Ser. No. 12/128,996, entitled "Method of Improving Minority Lifetime in Silicon Channel and Products Thereof," filed on May 29, 2008, which is incorporated herein by reference, now U.S. Pat. No. 7,851,339 issued Dec. 14, 2010.

FIELD OF DISCLOSURE

The present disclosure of invention relates generally to fabrication of MOS type field effect transistors and other such channel dependent semiconductor devices. The disclosure relates more specifically to lengthening of minority carrier lifetimes in channel regions of such devices.

DESCRIPTION OF RELATED TECHNOLOGY

A high quality MOS type field effect transistor (MOSFET) typically comprises a crystalline semiconductive substrate (e.g., monocrystalline silicon) having a surface area over which a gate oxide is thermally grown and under which a channel region of first conductivity type (e.g., N−) is defined. Separate source and drain regions of opposed second conductivity type (e.g., P) are typically defined under the substrate surface and abutting the channel region at opposed sides of the channel region. A conductive gate electrode, made for example of metal or heavily doped polysilicon, is disposed over the gate oxide. The gate electrode is used for forming an electric field between itself and at least one of the source and drain regions, where the gate-to-source/drain field is then used to selectively switch the device between a conducting mode (ON) and a substantially nonconductive mode (OFF).

When the gate-to-source/drain field is switched to the OFF state, the device channel region (e.g., N−) remains in a native state wherein it essentially allows only majority type charge carriers (e.g., electrons) to flow through it and not minority carriers (e.g., positive charged holes). The oppositely typed source and drain regions are at the same time configured to essentially allow just their majority type of charge carriers (e.g., holes) to flow through them but not the minority carriers (e.g., electrons) of the channel region. As such, no significant continuum of electrical current can flow from the source, through the oppositely-typed channel and into the drain. The transistor is thus deemed to be in a turned off state. (Another reason why the device is turned OFF is because a reverse biased PN junction typically forms between the P-doped drain and the N-doped channel. However, this aspect of the physics of turning off a channel-dependent device is not of importance here.)

By contrast, when the gate-to-source/drain electric field is switched to the ON state, a carrier population inversion effect occurs within the channel to a given depth below the substrate surface wherein that portion of the channel is filled with minority type (e.g., holes) charge carriers rather than majority carriers (electrons). Then, when appropriate field conditions are established between the source and drain regions, the minority type charge carriers (e.g., holes) are urged to drift through the channel from source towards drain and thus allow a current of substantial magnitude to flow through the channel region of the turned-on transistor. (Additionally, the gate induced inversion of carrier population in the channel region punctures the reverse biased PN junction between the channel and drain of the previously turned off device. However, this aspect of the physics of turning on a channel-dependent device is not of importance here.)

When a channel-dependent device (e.g., MOSFET) is switched from OFF to a saturated ON state, it is generally desirable to have a relatively large magnitude of source-to-drain current ($I_{ds}$) flowing through the turned ON device. More specifically, it is generally desirable to also have a relatively large ratio between the amount of $I_{dsON}$ current flowing through the device when it is turned to a saturated ON state and the amount of current $I_{dsLEAK}$ that leaks through (leakage current) the device when it is turned OFF. One of the factors that limits how large the magnitude of the turned ON current ($I_{dsON}$) can be relative to leakage current ($I_{dsLEAK}$) is the density of atomic scale voids or other such defects that can occur within the crystalline structure of the device's channel region.

During mass production of MOSFET's and/or other such channel-dependent devices, the monocrystalline wafers that are used to make these devices typically arrive at the factory with a large number of defects at their active surface and below. Accordingly, they are initially subjected to one or more defect reducing and/or defect curing process steps.

A conventional defect reducing/curing method typically begins with a cleaning of the surface of each bulk doped wafer (e.g., a wafer whose bulk volume is doped with say, N type dopants) so as to remove undesired contaminants. Then a sacrificial pad oxide layer is thermally grown to protect the cleaned surface from re-contamination. Next the wafers are placed in a high temperature furnace whose interior is filled with a relatively inert atmosphere such as one essentially consisting of Argon (Ar) or Hydrogen ($H_2$). The wafers are held at high temperature (e.g., greater than 1100° C. in the furnace for a very long time (e.g., more than 10 hours). This step is generally referred to as a high temperature anneal. The hope is that thermal agitation of the atoms in the wafers will cause silicon and other atoms (e.g., dopants) to redistribute themselves more uniformly within the wafers and thereby fill any large voids within the associated crystalline structures so as to thereby reduce or eliminate voids and other defects in the base silicon substrates.

Unfortunately, despite the many long hours spent and high temperatures endured in the defect curing ovens (initial anneal steps), the wafers still come out with their microstructures riddled with an appreciable number of minute voids. These micro voids, even though they are small, can still pose a problem in the critical channel regions of channel dependent devices (e.g., MOSFET's) as shall be detailed shortly. After the long initial anneal, the protective pad oxide layers are stripped off from the wafers. The wafer surfaces are cleaned again. Then a gate oxide is carefully grown by thermal growth or other techniques so as to begin formation of the critical gate and channel operative regions of the channel-dependent devices (e.g., transistors) that will be defined in the wafer.

Later, after formation of the channel-dependent devices is finished, the wafers are sliced and diced (to create individual IC dice), chips are individually packaged and their circuits are powered up. Within turned-on ones of the channel-dependent device (e.g., transistors), minority charge carriers in respective channel regions sporadically encounter the minute voids (defects) left behind in the device substrate that had not been fully cured by the initial defect reducing/curing methods. The minority carriers can be annihilated by such encounters with left behind voids. For example a positively charged hole that drifts into a void may recombine with a nearby electron and thus be annihilated. As a result of minority carrier encounters with left behind voids, some charge carriers fail to drift fully across the channel and thus they fail to contribute to the desired magnitude of current ($I_{dsON}$) that is to be conducted by the channel when the device is supposed to be in a turned ON mode. Additionally, undesirable heat may be generated when minority charge carriers are annihilated by encounters with crystal defects (e.g., left behind voids). As such, large densities of even minute defects (e.g., where just singular atoms are missing here and there from the regular lattice structure) can contribute to poor device performance and generation of excess heat.

In view of the above, it may be appreciated that there is a long felt desire in the field of semiconductor mass production to find methods which reduce annihilation of minority charge carriers by crystal defects such as left behind voids. Stated otherwise, there is a desire to increase the average lifetimes of minority carriers within channel regions. Incidentally, the channel-dependent devices discussed herein are not limited to conventional MOSFETs and may include other field effect devices such as floating gate memory cells.

One conventional answer to the problem of left behind micro voids is simply to increase the time spent by wafers in the initial annealing furnaces. However, the long hours spent in the defect curing ovens are costly both in terms of energy expended to keep the wafers hot and in terms of the time and other resources consumed by prolonging the anneal process. Moreover, longer time spent in the high temperature anneal furnaces does not guarantee that micro voids and other defects will be cured to an extent desired.

SUMMARY

A defect repair process in accordance with the present disclosure blanket covers a to-be cured wafer with a sacrificial oxide layer that is doped to contain chlorine (Cl) and/or other relatively small atoms whose ions can be negatively charged (e.g., other halogens). The oxide coated wafer is then subjected to an anneal atmosphere (e.g., NO) that can readily produce positively charged nitrogen ions ($N^+$). Without wishing to be bound to the following theory, it is believed that during the high temperature anneal in the nitrogen ion producing atmosphere, small negatively charged ions (e.g., $Cl^-$) diffuse to become intercalated deeply into the silicon crystal structure below the sacrificial oxide layer that provides them. It is believed that these intercalated negatively charged ions (e.g., $Cl^-$) then help draw positively charged nitrogen ions ($N^+$) also deeply into the silicon crystal structure whereupon the drawn in nitrogen atoms fill in voids within the crystal structure, bind with the surrounding silicon and thereby repair (fill in) at least some of the minute voids within the silicon crystal structure, thus reducing void-induced annihilation of minority carriers and increasing bulk minority carrier lifetimes.

After the deep fill, nitrogen repair process is carried out; the sacrificial oxide layer that supplies the small negatively charged ions (e.g., $Cl^-$) is stripped off, the wafer is cleaned, and an operative gate oxide or tunnel oxide is thermally grown. Formation of the operative gate or tunnel oxide may be preceded by or include a shallow surface nitridation process wherein the top surface of the channel region is sealed with a stoichiometric monolayer of $Si_3N_4$. This shallow surface nitridation process does not introduce nitrogen into the channel region to the same deep extent as does the deep fill, nitrogen repair process. The shallow surface nitridation step may be used for example to inhibit seepage through a thin tunnel oxide of boron contaminants from a heavily P+ doped floating gate formed above the tunnel oxide and doped with boron.

A semiconductor device in accordance with the disclosure comprises a monocrystalline silicon substrate which has been subjected to a high temperature anneal in a nitrogen releasing atmosphere while the substrate is coated by a halogen containing oxide coating. In one embodiment, voids within the crystal structure of the monocrystalline silicon substrate are filled with nitrogen atoms to a depth below the surface of the substrate sufficient to substantially improve transistor transconductance within device relative to a transistor transconductance that would have been obtained if the high temperature anneal had instead been in an inert atmosphere and with an oxide pad coating that is essentially devoid of halogen dopants.

Other aspects of the disclosure will become apparent from the below detailed description.

BRIEF DESCRIPTION OF THE DRAWINGS

The below detailed description section makes reference to the accompanying drawings, in which:

FIG. 3A is a generic diagram for explaining experiments shown in

FIG. 3B;

DETAILED DESCRIPTION

Figure 1A:
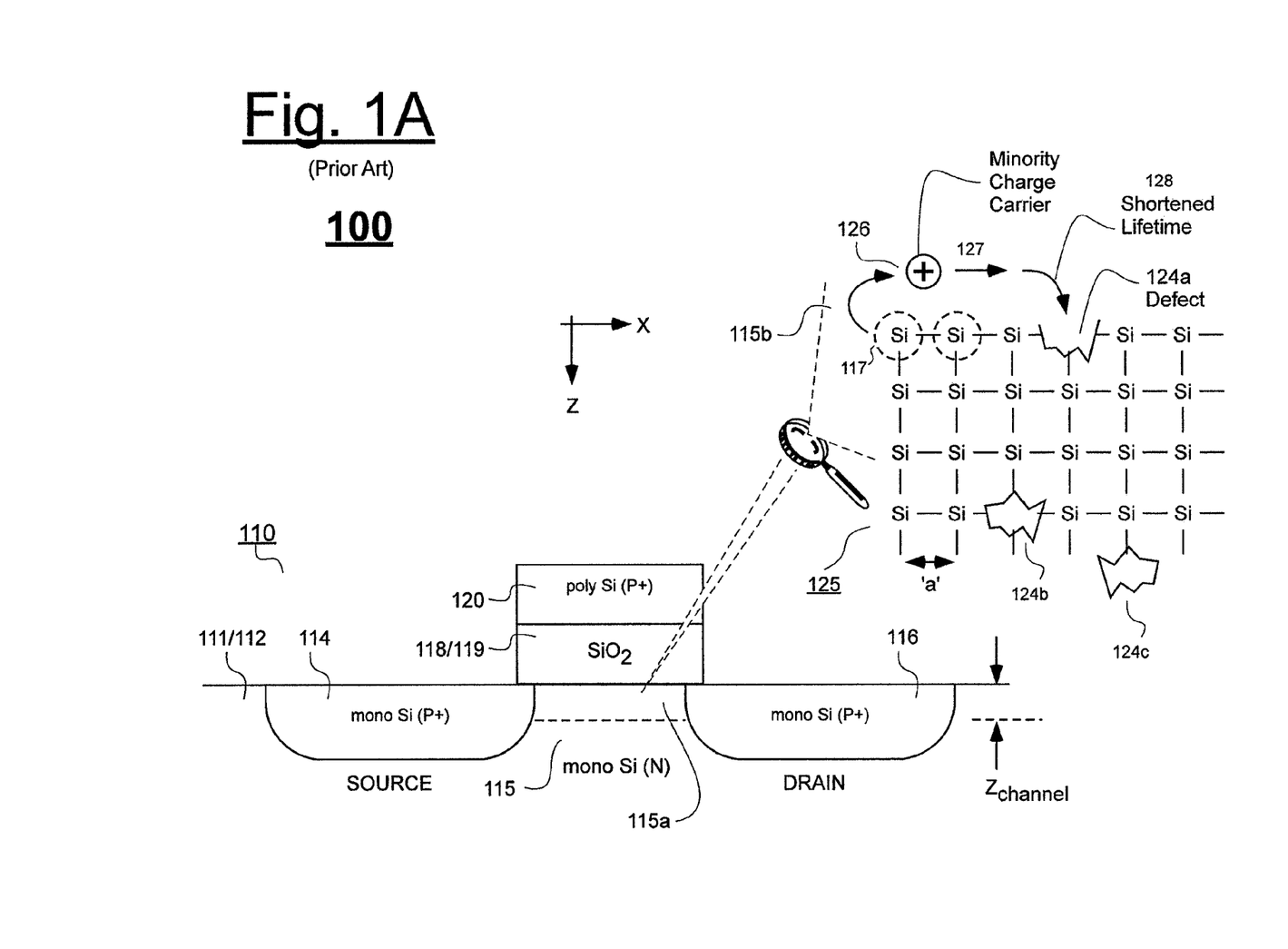
FIG. 1A is a combination cross sectional view schematic and atomic lattice schematic for explaining how micro voids can shorten minority carrier lifetimes.

FIG. 1A includes a cross sectional side view of a conventional P-channel MOSFET 110 as may be found in a conventional monolithic integrated circuit 100 (not fully shown). As will be readily discerned by those skilled in the art, transistor 110 is formed in a monocrystalline silicon substrate 112 whose bulk is doped with N-type conductivity dopants. Respective source and drain regions 114 and 116 are defined on opposed sides of channel region 115 by implant of P+ dopants after formation of an operative gate oxide layer 119 and polysilicon gate layer 120. (FIG. 1A actually shows both before and after structures relative to a wafer anneal process described in FIG. 1B. The substrate before the anneal is denoted as 111 while the substrate after the anneal is denoted as 112. Similarly, the operative gate oxide layer formed after the anneal is denoted as 119 while a sacrificial pad oxide layer present before the anneal is denoted as 118.)

During operation of the MOSFET 110, polysilicon gate layer 120 may be driven to a sufficiently negative voltage relative to the source region 114 ($V_{gs} < V_t < 0$) so as to attract holes (positive charge carriers) into sub-region 115a of channel 115 so as to thereby invert the predominant charge carrier population of sub-region 115a from being electrons (negative or N type charge carriers) to being holes (positive charge carriers). The so induced, minority charge carriers (holes, see example 126 in magnification 115b) are typically created to a depth, $Z_{channel}$ of about 1 µm (one micron) in modern devices. This $Z_{channel}$ deep-region 115a is therefore now filled with minority charge carriers (holes) which can conduct a corresponding magnitude of current ($I_{dsON}$) from the source region 114 to the drain region 116 when a relatively negative voltage relative to source region 114 ($V_{ds} < 0$) is applied to the drain region 116 so as to attract holes (positive charge carriers). The attracted holes drift in the illustrated X direction from the source region 114 through the inverted channel sub-region 115a and into the drain region 116.

Referring to the magnified schematic view of sub-region 115a as shown at 115b, an ideal monocrystalline silicon structure is formed by repeating cubes having silicon atoms (Si) at their corners where the repeat distance is known as the lattice constant ('a') of the monocrystal. Each silicon atom has four valence electrons in its outer shell 117 that allow it to bind in four directions to adjacent silicon atoms, thus creating the ideal cubic lattice structure. In an N-doped channel such as 115 of FIG. 1A, an impurity atom (not shown) with 5 valence electrons is substituted into the lattice structure every so often to thereby give the semiconductive region 115 its N-type conductivity characteristic. When population inversion takes place in channel sub-region 115a, a sufficient number of the dopant supplied electrons are pulled away so that the inverted sub-region 115a is predominated by freely movable holes (e.g., by outer orbitals that that are missing one of their 4 allotted electrons per silicon atom) as opposed to freely movable electrons. Such freely movable holes 126 may easily drift 127 from one outer orbital 117 to that of a next silicon atom and in a desired drift direction (X) when the silicon atoms (or substitute dopant atom) are spaced apart by the ideal lattice repeat constant ('a'). However, if a hole 126 that is drifting in a desired drift direction (X) encounters a micro void 124a (a defect, a missing Si atom) in the crystal structure, the moving hole may lose velocity in the desired drift direction (X) and drop (i.e., in the Z direction) into an orbital of a silicon atom that has an energetic electron, whereby the hole may be annihilated by combination with the energetic electron. This annihilation reduces the amount of current ($I_{dsON}$) being carried by the inverted channel sub-region 115a and it often generates undesired heat energy and/or radiation.

The rate at which minority charge carriers (e.g., 126) are annihilated is sometimes measured indirectly by measuring the average lifetimes of such charge carriers. For example, the Quantox™ tool available from KLA-Tencor can be used to measure bulk minority carrier lifetime. Increased minority carrier lifetime can be attributed to reduced numbers of annihilations such as those due to encounters with crystal defects (e.g., micro voids). Large numbers of defects such as voids 124a-124c throughout the operative depth ($Z_{channel}$) of the inverted channel sub-region 115a typically leads to the observation of relatively short minority carrier lifetimes (128). Smaller densities of and smaller sizes of voids 124a-124c throughout the depth ($Z_{channel}$) of the inverted channel sub-region 115a typically leads to observance of relatively longer minority carrier lifetimes.

Figure 1B:
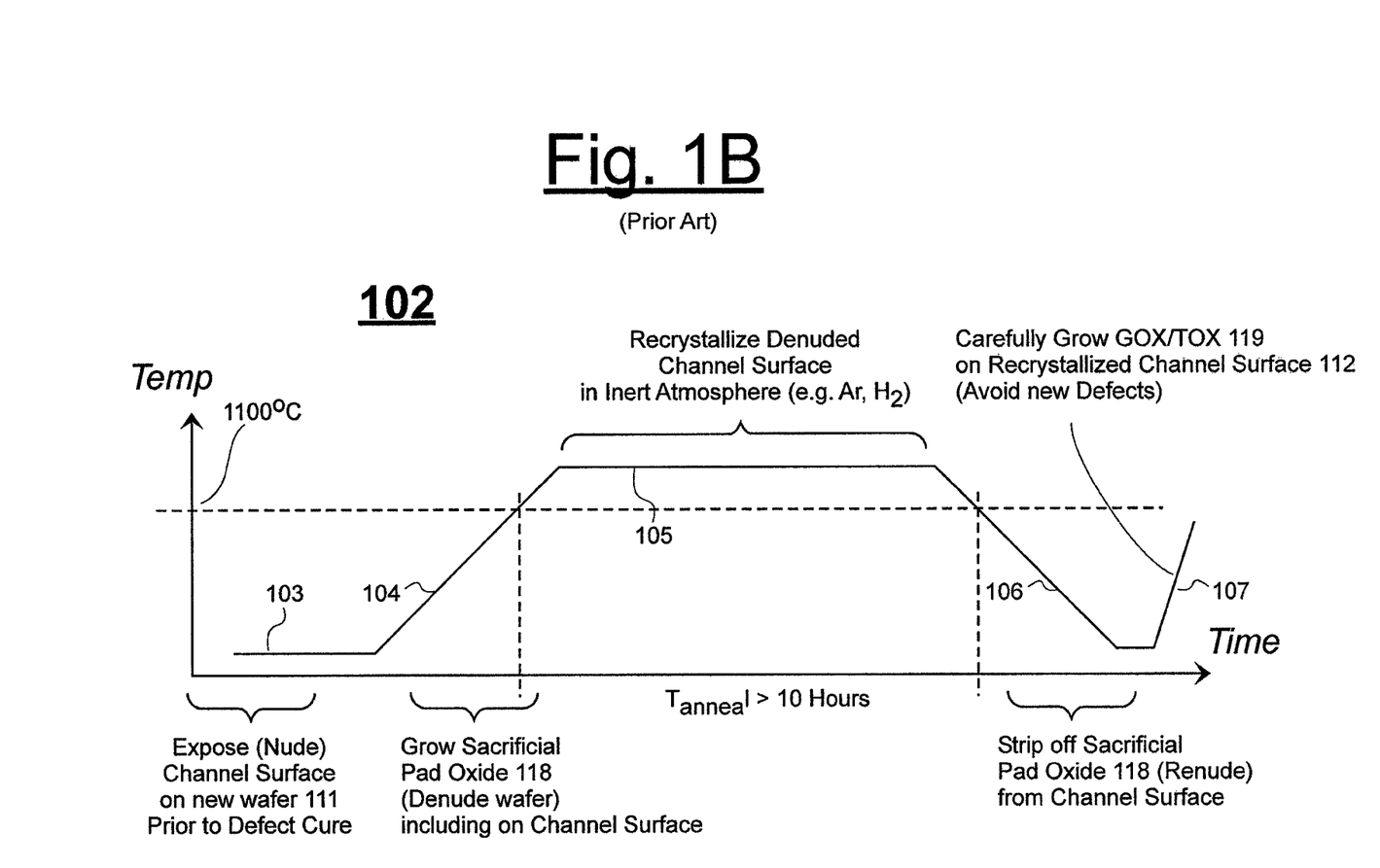
FIG. 1B is a temperature versus time graph for describing a conventional defect cure process.

Referring to FIG. 1B, in order to reduce the sizes and numbers of crystal defects (e.g., voids 124a-124c) in semiconductor devices, it is common to subject incoming new wafers at a semiconductor mass production facility to one or more defect reducing and/or curing process steps such as that 102 represented by the temperature versus time graph shown in FIG. 1B.

It is to be understood in referring to FIG. 1B that the operative gate oxide layer (GOX) 119 of FIG. 1A has not yet been grown and the etched, polysilicon layer 120 has not yet been deposited, and source and drain regions 114, 116 have not yet been implanted. Instead, just the initial silicon substrate 111 is present. At step 103 of FIG. 1B, the top surface of the pre-anneal substrate 111 is exposed (denuded) and carefully cleaned within a sealed process chamber. Then the substrate 111 is heated (104) and an oxidizing atmosphere is introduced so as to thereby thermally grow a sacrificial pad oxide layer 118 on the substrate surface. (Eventually sacrificial layer 118 will be replaced in FIG. 1A by operative gate oxide layer 119.)

After growth of pad oxide 118 to a desired thickness, the oxidizing atmosphere is replaced with an essentially inert atmosphere such as one consisting of argon (Ar) and/or hydrogen (H2) and the temperature is raised (104) even higher, typically to well above 1100° C. This high temperature and the inert atmosphere are maintained for a very long time, generally in excess of 10 hours ($T_{anneal} > 10$ hrs.). After the anneal step 105 is carried out for a sufficiently long time ($T_{anneal} > 10$ hrs.) as specified by a predefined anneal recipe, the furnace is cooled (step 106) to room temperature. The sacrificial pad oxide layer 118 is selectively stripped off and the wafer is again cleaned. Then in step 107, heat is again applied in the presence of an appropriate oxidizing atmosphere as the process of carefully growing an operative gate oxide or tunnel oxide on channel surface 112 begins.

Referring back to FIG. 1A, despite the long time ($T_{anneal} > 10$ hrs.) and high temperatures (>1100° C.) endured in the initial anneal furnaces, the silicon crystal material in the sub-channel region 115a may still be riddled with a significant number of micro voids 124a-124c where these voids are generally formed due to the absence of one or a handful of silicon atoms or dopant atoms in the corresponding 'a'-defined position of the crystal lattice. Micro voids or other defects may be additionally introduced into the substrate by bulk or are specific implants such as threshold voltage adjusting implants. Thus when minority charge carriers (e.g., 126) encounter left behind or newly induced micro voids, the charge carriers can be undesirably annihilated and saturation current of the turned ON device can be undesirably reduced as a result. Incidentally, although FIG. 1A illustrates a single gate PMOS device 110, much of the discussion herein is similarly applicable to NMOS devices wherein the illustrated doping polarities are reversed (P and N are swapped). The discussion herein is similarly applicable to CMOS circuitry (contains both PMOS and NMOS devices), to Flash memory arrays, to E2PROM memory arrays, to DRAM arrays and so on; in general to any channel-dependent device where presence of voids in the active channel sub-region 115a is undesirable.

Figure 2A:
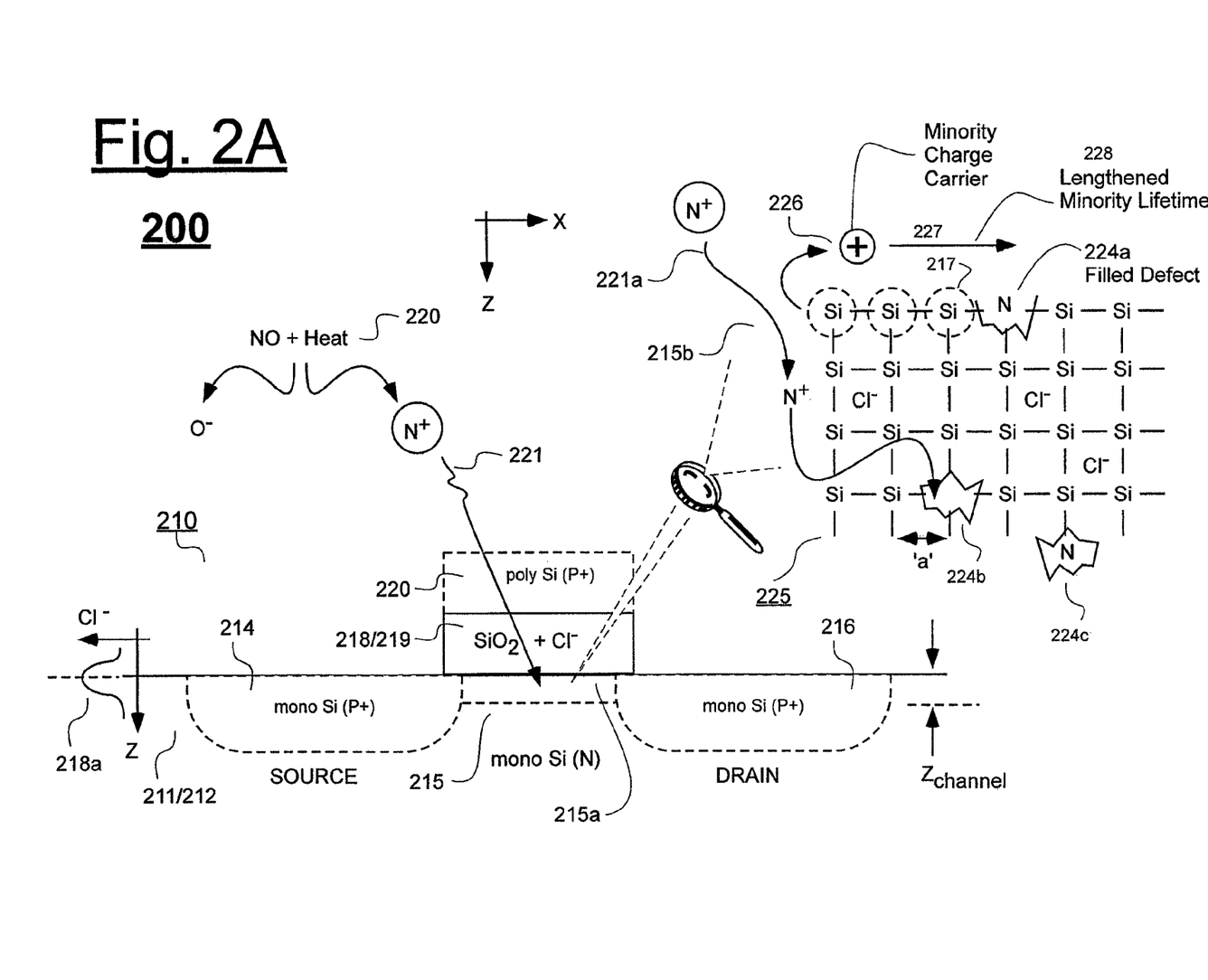
FIG. 2A is a combination cross sectional view schematic and atomic lattice schematic for explaining how micro voids can be filled by a defect repair process in accordance with the present disclosure.

FIG. 2A is a combination cross sectional view (210) and atomic lattice schematic (215b) for explaining how relative deep subsurface micro voids (e.g., 224b, having a depth of substantially more than 0.1 µm and going as deep as 1 µm or more) can be filled by a defect repair process in accordance with the present disclosure. Like reference symbols and numbers in the "200" series are used for elements of FIG. 2A which correspond to but are not necessarily the same as the elements represented by similar symbols and reference numbers of the "100" series in FIG. 1A. As such, an introductory description for many of the elements found in FIG. 2A is omitted here.

In FIG. 2A, the source and drain regions 214, 216 as well as gate layer 220 are shown in phantom (dashed lines) because these are not yet formed. On the other hand, sacrificial pad oxide layer 218 is partially shown in solid. Layer 218 is understood to have been blanket deposited or grown on a cleaned surface of pre-anneal silicon substrate 211. Layer 218 includes one or more small sized elements that can become intercalated deeply into the silicon crystal structure (e.g., at least to a predefined $Z_{channel}$ depth (e.g., 1 µm) corresponding to a prespecified inversion sub-region 215a) of channel-dependent devices that are to be formed in post-anneal version 212 of the substrate. In one embodiment, layer 218 consists essentially of silicon dioxide ($SiO_2$) and about 1% to 10% by atomic concentration (e.g., 5%) of chlorine atoms formed for example by CVD deposition of a mixture of dichlorosilane (DCS) and N2O over denuded silicon substrate 211. In one embodiment, layer 218 is formed to a thickness of about 50 Å to 300 Å, and having 1% to 10% Cl concentration by means of LPCVD deposition using DCS+N2O (with gas flow rates being DCS=5 to 50 SCCM, N2O=10 to 500 SCCM) at a pressure of about 100 mTorr to 1500 mTorr for a time period of about 10 min to 300 min. Without wishing to be bound to the following theory, it is believed that with application of high temperature, the chlorine atoms in the formed $SiO_2$+Cl layer 218 are diffusible at high temperature and thus generate a diffuse solid state gas of negatively charged ions (e.g., $C^-$) when heated, where the diffused ions become deeply intercalated or otherwise diffused deeply (e.g., to more than 0.1 µm deep) within the substrate 211 as indicated by diffusion graph 218a. These deeply diffused and negatively charged ions (e.g., $C^-$) then help to draw positively charged nitrogen ions ($N^+$) that are supplied from a nitrogen ion producing atmosphere 220 deeply into the silicon crystal structure (e.g., to more than 0.1 µm deep) by for example electric attraction whereupon the drawn-in nitrogen atoms fill in voids like 224b at relatively deep depths (e.g., to more than 0.1 µm deep and even as much as 1 µm deep or deeper) within the crystal structure. The drawn down nitrogen ions have 4 outer valence electrons ($:N:^+$) that can temporarily bind with a surrounding 4 silicon atoms surrounding a single atom-wide void. The drawn in nitrogen atom can thereafter remain in place and repair (fill in) the micro void within the silicon crystal structure, thus reducing void-induced annihilation of minority carriers deep within the substrate and thus increasing bulk minority carrier lifetimes. More specifically, with the single atom void 224a being filled in by a drawn-in nitrogen atom, drifting hole 226 can continue with its X direction drift 227 from the outer valence shell 217 of one void-adjacent atom to the outer valence shell of the void-filling nitrogen atom and beyond. Thus minority charge carrier lifetime is significantly lengthened (228).

Aside from chlorine atoms, the sacrificial pad oxide layer 218 may be doped with other small sized atoms such as bromine (Br) or sulfur (S) or Fluorine (F) or Phosphorus (P) which can ionize to define negative charge points that can temporarily diffuse deeply into the crystal lattice structure and thereby attract positively charged nitrogen ions to deeper regions of the silicon lattice structure. As understood by skilled artisans, nitrogen can easily bind to silicon oxide to form a silicon oxinitride complex ($Si_xO_yN_z$, x+y+z=100%) and nitrogen can easily bind to silicon to form a silicon nitride complex ($Si_xN_y$, x+y=100%) including stoichiometric $Si_3N_4$. Such SiON and SiN complexes tend to be self-sealing monolayers, meaning that once formed they inhibit additional nitrogen from diffusing deeper into the underlying silicon. However, it is believed that co-diffused negative ions such as $Cl^-$ ions can function to pull nitrogen ions deeper into the substrate 211/212 than possible with simple surface nitridation techniques and the deeply diffused negative ions thereby function to inhibit self-sealing monolayers of SiON and/or SiN from forming quickly at the $SiO_2$/Si interface between layers 218 and 211/212 to thereby inhibit deep diffusion of nitrogen atoms.

One defect repair method in accordance with the present disclosure comprises the step of effectively wet cleaning the surface of a supplied silicon monocrystal wafer with a solution of wet chemicals, such as with an RCA™ clean. This is followed by thermal growth and/or physical vapor deposition of a chlorine-doped oxide layer 218 where concentration of chlorine is at least about 1% by atomic percentage. This is followed by exposure of the oxide padded wafer to a nitrogen ion producing atmosphere such as one containing NO (nitric oxide) and heating to at least about 800° C. (or more, e.g., 1050° C.) in a furnace for a sufficient time (e.g., more than 1 hour, better yet 3 hours, but less than 10 hours) so as to anneal the lattice structure and induce void repair by deep diffusion of nitrogen atoms at least to the expected $Z_{channel}$ depth of sub-channel regions 215a that will be later formed in the wafer.

Prior to cool down, the deep nitrogen diffusion step may be optionally followed with shallow surface nitridation wherein further nitrogen atoms are infused near the substrate surface (to a depth of about 0 to 0.1 µm) by use of RTP (rapid thermal process heating) in a nitrogen supplying atmosphere. For example, the RTP chamber could produce a short term wafer high temperature of greater than 1000° C. for about 1 minute or more at a pressure of 100 Torr to about 1000 Torr and with a gas flow rate of NO at about 1 to 10 l/m (liters per minute). The temperature and time used for the shallow surface nitridation may vary depending on how many near-surface voids the nitrogen is to move into (also how deep) where these values are empirically determined by measuring densities of near-surface defect numbers. In other words, higher surface defect densities may require infusion of more nitrogen atoms (thus calling for higher temperature and longer time) in order to heal the greater number of surface adjacent defects. To heal defects even deeper (>0.1 µm), the RTP furnace could be used to introduce nitrogen at >800° C. for more than 1 hour at 100 Torr to 1000 Torr and an NO gas flow rate of about 1 to 20 l/m.

Although confirmatory experimental results (see FIG. 3B, test 353) have been obtained with a sacrificial Cl-doped LPCVD deposited oxide having 10% chlorine by atomic concentration embedded therein and an NO atmosphere heated to 1050° C. for at least an hour (nominally 3 hours), it is believed that other nitrogen releasing atmospheres such as one comprising NH3 and other negative ion releasing oxide layers such as those comprising at least 1% by atomic concentration of alternate diffusible atoms (e.g., Br, S, F and/or P) with a total atomic percentage concentration of at least 1%, optionally 5% and even as high as at least 10% may be used to obtain similar results wherein a void repairing atom such as a nitrogen atom is enabled to diffuse deeply into the substrate with the help of the co-diffused negatively chargeable atoms (e.g., Cl, Br, S, F and/or P) sourced from the doped sacrificial oxide layer. Instead of being CVD deposited, the doped sacrificial oxide layer 218 may be thermally grown (e.g., in an atmosphere containing chlorine and oxygen) or otherwise formed.

The deep nitrogen diffusion step (and optional shallow surface nitridation) is followed by cool down to room temperature and selective removal of the sacrificial oxide layer 218 and of an underlying SiON film (not shown) that tends to form below layer 218 due to the deep nitridation process. Thereafter, the denuded wafer surface is cleaned and a gate oxide or tunnel oxide is grown for example by means of radical oxidation techniques such as furnace radical oxidation or ISSG (In Situ Steam Generation). In one embodiment, formation of the gate oxide or tunnel oxide is preceded by a shallow nitridation step that forms a monolayer of SiN over the channel region so as to later retard undesirable diffusion of boron (B) from an overlying P+ gate (e.g., a floating gate).

Referring still to FIG. 2A, although not fully shown, it is to be understood that gate electrode 220 will be operatively coupled to gate driving electronics (e.g., directly or through an overlying and insulated control gate) for causing minority charge carriers to appear in the sub-channel region 215a. It is to be understood that source region 214 and drain region 216 will be similarly operatively coupled to source and drain driving electronics for creating source to drain electric fields and inducing drift of the generated minority charge carriers through the sub-channel region 215a. FIG. 2A is to be seen as contemplating completion of an operative monolithic integrated circuit wherein sidewall insulation is optionally added to the stack defined at least by oxide layer 219 and gate layer 220, wherein respective source and drain contacts are optionally made to implanted source and drain regions 214, 216 through a protective dielectric layer, wherein a gate interconnect connection is made to gate layer 220 or to a control gate above it in the case where layer 220 is a floating gate of a memory cell and where other drive electronics operatively couple to the gate, source and drain regions so as to make use of transistor 210.

Figure 2B:
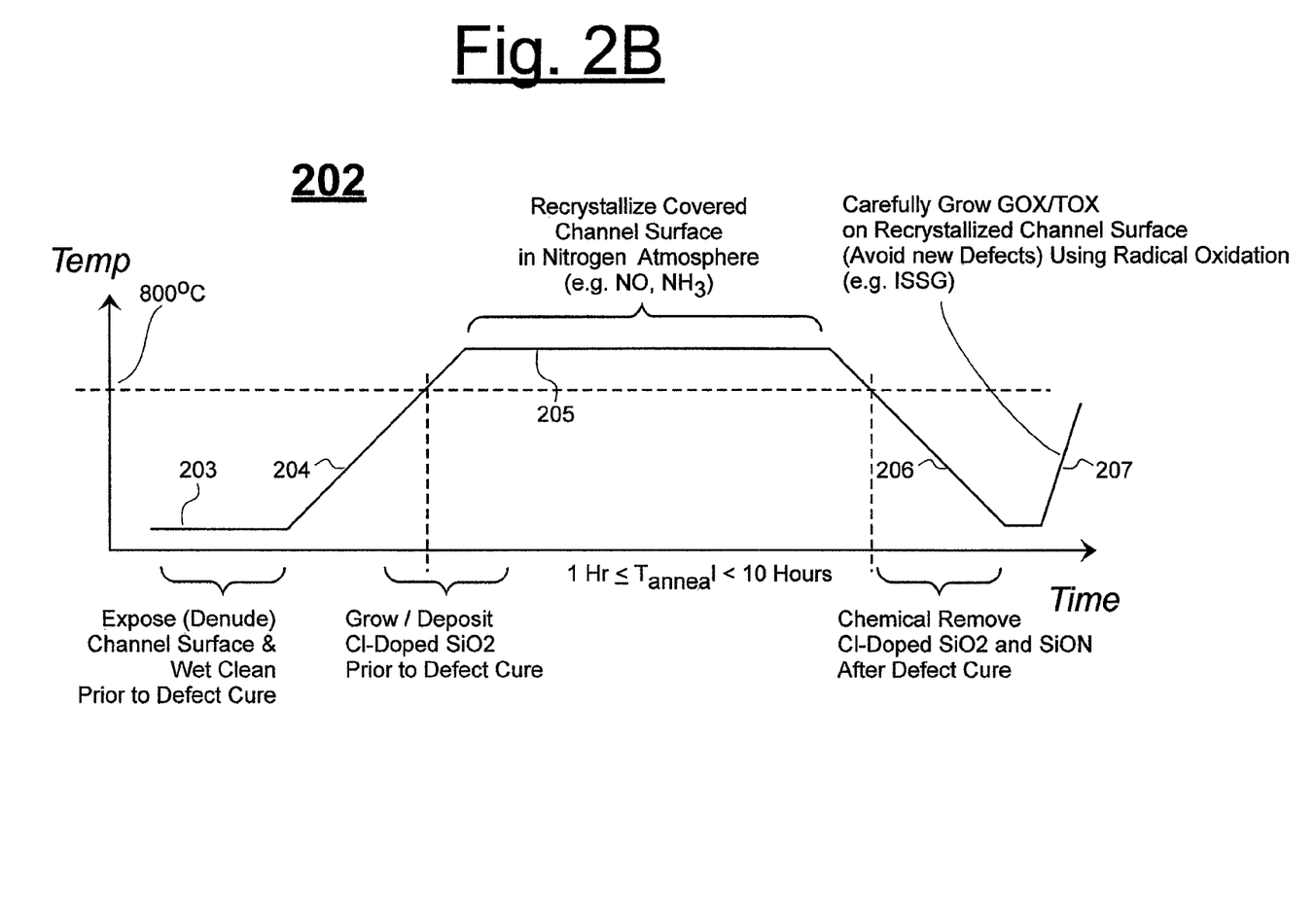
FIG. 2B is a temperature versus time graph for describing a deep defect repair process in accordance with the present disclosure.

Referring to FIG. 2B, like reference symbols and numbers in the "200" series are used for elements of FIG. 2B which correspond to but are not necessarily the same as the elements represented by similar symbols and reference numbers of the "100" series in FIG. 1B. Accordingly, step 203 is the pre-anneal cleaning step. Step 204 includes thermal growth and/or PVD deposition of the Cl doped oxide layer followed by introduction of the nitrogen donating atmosphere (e.g., NO and/or NH3) and raising the temperature to above about 800° C. (e.g., to 1050° C.). Step 205 includes maintenance of the high temperature and nitrogen donating atmosphere in the furnace for a sufficient time (e.g., more than 1 hour, less than 10 hours, in other words nominally for about 3 hours as an example) so as to anneal the lattice structure and induce void repair by deep diffusion of nitrogen atoms at least to the expected $Z_{channel}$ depth of sub-channel regions 215a that will be later formed in the wafer. Step 206 represents the post-anneal cool down followed by wet chemistry selective removal of the Cl doped oxide layer and of a SiON layer that may have developed below the doped oxide layer. This is followed by surface cleaning steps and optionally by the deposition of a monolayer of silicon nitride. Step 207 represents the next heat up of the wafer and formation of the operative gate oxide or tunnel oxide layer for example by radical oxidation.

Figure 3A:
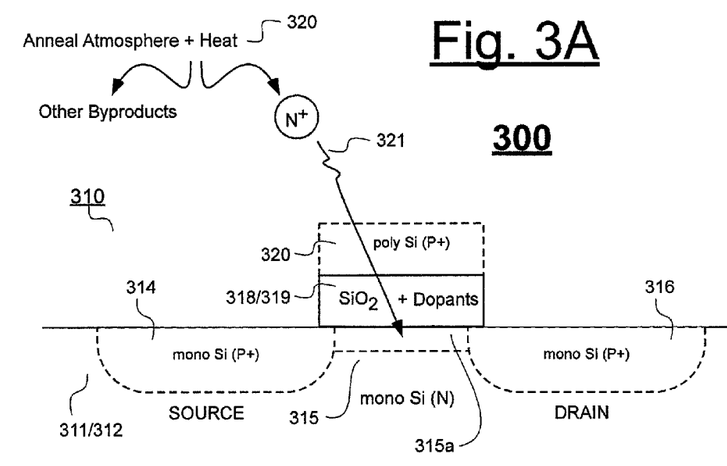
Figure 3B:
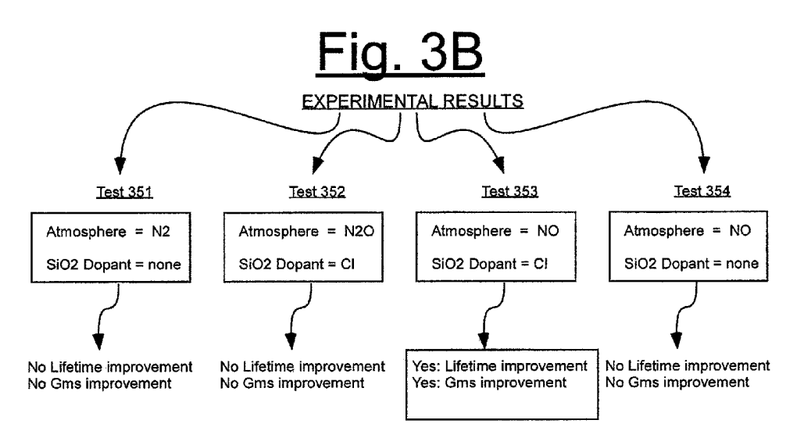
FIG. 3B is a flow chart showing four experimental permutations and the results of each.

Referring to FIGS. 3A and 3B, the present invention was unexpectedly discovered during conduction of a number of experiments directed to an unrelated goal. After measurement of minority lifetime profiles and transistor transconductance (Gms) results in the product, it was discovered that one of the experiments had produced superior results, namely experiment 353 of FIG. 3B. Experiments 351-353 used different combinations of anneal atmosphere 320 and doping of the pad oxide 318 with Cl or no doping. Without wishing to be bound to this theory, it is believed that the NO containing atmosphere of experiment 353 produced a substantial number of positively charged nitrogen ions ($N^+$) while the Cl doped pad oxide layer generated a solid state gas of negatively charged chlorine ions ($Cl^-$) that diffused deep into the substrate (315a). It is believed that the oppositely charged ions somehow interacted to allow nitrogen atoms to permeate deeply into the channel region 315a and fill micro voids therein. Experimental test 352 used a nitrogen containing atmosphere having nitrous oxide ($N_2O$) as its nitrogen supplier and a Cl-doped oxide layer 318. It is suspected that during anneal this compound does not produce a significant number of free nitrogen ions ($N^+$) and that is why improved minority lifetimes were not observed whereas experimental test 353 did produce improved minority lifetimes. Experimental test 354 used an anneal atmosphere containing nitric oxide (NO) and an undoped oxide layer 318. Comparison of experiments 353 and 354 demonstrates that the Cl-doping of oxide layer 318 in 353 plays a critical role in producing the improved minority lifetime results.

Figure 4A:
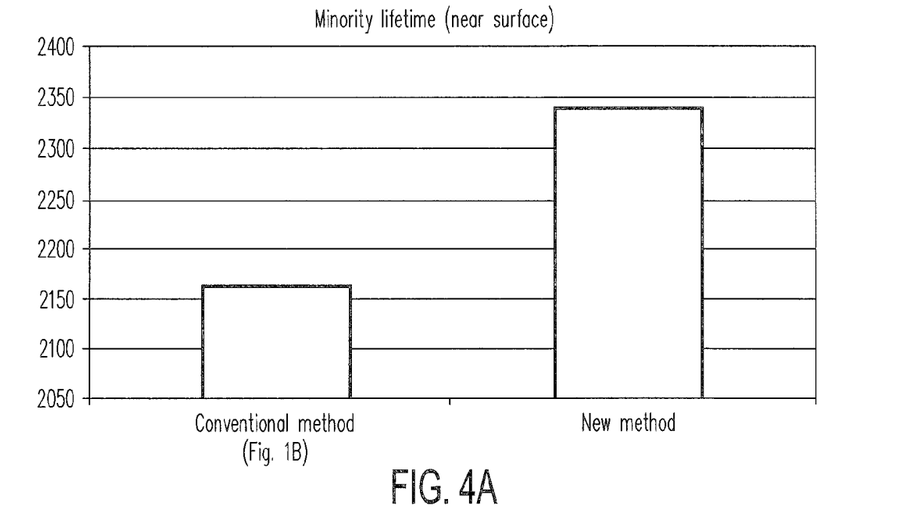
FIG. 4A is a bar graph comparing near surface minority lifetimes for a conventional process such as that of FIG. 1B and a deep defect repair process such as that of FIG. 2B (without the optional near surface nitridation)

FIG. 4A shows the minority lifetime results of experimental test 353 versus minority lifetime results for a conventional anneal (FIG. 1B). The Quantox™ tool available from KLA-Tencor was used in both instances to measure bulk minority carrier lifetime in terms of micro-seconds. Increased minority carrier lifetime (about 9% better) in the case of experimental test 353 versus the conventional anneal (FIG. 1B) can be attributed to nitrogen repair (fill in) of crystal defects (e.g., micro voids). For the case of the new method (FIG. 2B) the anneal was performed without the optional near surface nitridation for surface depth of about 0 to 0.1 μm).

Figure 4B:
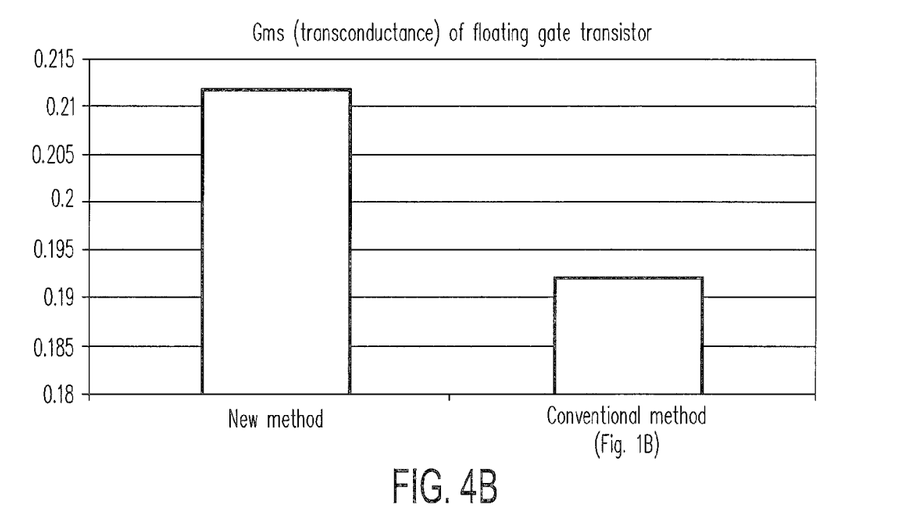
FIG. 4B is a bar graph comparing transistor transconductance values (Gms) for similar floating gate transistors formed on wafers that had been treated with the conventional process of FIG. 1B and the deep defect repair process such of FIG. 2B (but without the optional near surface nitridation).

FIG. 4B shows transistor transconductance results ($Gms=\Delta I_{ds}/\Delta V_{gs}$) for floating gate memory transistors fabricated under experimental test 353 conditions versus similar devices manufactured with use of a conventional anneal (FIG. 1B). Transconductance numbers are in terms of micro-SIEMENS (also defined as microamps per volt). It is believed that the longer minority carrier lifetimes of the transistors fabricated under the experimental test 353 conditions resulted in the observed 10% (approximately) in transistor transconductance. For the case of the new method (FIG. 2B) the anneal was performed without the optional near surface nitridation for surface depth of about 0 to 0.1 μm).

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein. Descriptions above regarding related technologies are not admissions that the technologies or possible relations between them were appreciated by artisans of ordinary skill in the areas of endeavor to which the present disclosure most closely pertains.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A semiconductor device comprising:
   a monocrystalline silicon substrate; and
   a gate electrode, disposed above and insulated from a surface of the monocrystalline silicon substrate, the gate electrode overlying a first region of the monocrystalline silicon substrate, wherein the first region extends laterally at least as far as the gate electrode;
   wherein the monocrystalline silicon substrate has been subjected to a high temperature first anneal in a nitrogen releasing atmosphere while the substrate was coated by a doped sacrificial first oxide layer that was doped with diffusible atoms selected from the group consisting of CI, Br, S, F and P, where in the sacrificial first oxide layer, said diffusible atoms spread continuously over at least the entire first region, and where said diffusible atoms constituted at least 1% by atomic percentage of atoms in the sacrificial first oxide layer and where said high temperature of the first anneal allowed nitrogen atoms released from said atmosphere to penetrate into the substrate to a predetermined depth below the doped sacrificial first oxide layer;
   where the diffusible atoms and the nitrogen atoms are present in the monocrystalline silicon substrate, and at least one of (A) and (B) is true:
   (A) the nitrogen atoms spread continuously in the monocrystalline silicon substrate throughout at least the entire first region;
   (B) the diffusible atoms spread continuously in the monocrystalline silicon substrate throughout at least the entire first region; and
   where the gate electrode is coupled to drive circuitry for inducing a drift of minority charge carriers below said surface.

2. The semiconductor device of claim 1 wherein:
   said diffusible atoms constituted at least 5% by atomic percentage of atoms in the sacrificial first oxide layer.

3. The semiconductor device of claim 1 wherein:
   said diffusible atoms constituted at least 10% by atomic percentage of atoms in the sacrificial first oxide layer.

4. The semiconductor device of claim 1 wherein:
   said diffusible atoms constituted at least 5% by atomic percentage of chlorine atoms in the sacrificial first oxide layer.

5. The semiconductor device of claim 1 wherein:
   said nitrogen releasing atmosphere included NO.

6. The semiconductor device of claim 1 wherein:
   said high temperature first anneal was carried out at a temperature of about 800° C. or more, but less than 1100° C.

7. The semiconductor device of claim 6 wherein:
   said high temperature first anneal was carried out for more than 1 hour but less than 10 hours.

8. The semiconductor device of claim 1 and further comprising:
   a source region disposed along a first side of a portion of the surface of the silicon substrate which has been subjected to the high temperature first anneal, where the source region is coupled to circuitry for inducing a drift of minority charge carriers below said portion of the surface; and
   a drain region disposed along an opposed second side of the portion of the surface of the silicon substrate which has been subjected to the high temperature first anneal, where the drain region is coupled to circuitry for inducing a drift of minority charge carriers below said portion of the surface.

9. The semiconductor device of claim 1 and further wherein:
   the monocrystalline silicon substrate which has been subjected to a high temperature second anneal in a nitrogen releasing atmosphere while the substrate was exposed so that shallow surface nitridation takes place after said first anneal in a nitrogen releasing atmosphere takes place.

10. The semiconductor device of claim 1 wherein (A) is true.

11. The semiconductor device of claim 1 wherein (B) is true.

12. The semiconductor device of claim 1 wherein (A) and (B) are true.

13. A semiconductor device comprising:
    a monocrystalline silicon substrate which has been subjected to a high temperature first anneal in a nitrogen releasing atmosphere while the substrate was coated by a doped sacrificial first oxide layer that was doped with diffusible atoms selected from the group consisting of CI, Br, S, F and P, where said diffusible atoms constituted at least 1% by atomic percentage of atoms in the sacrificial first oxide layer and where said high temperature of the first anneal allowed nitrogen atoms released from said atmosphere to penetrate into the substrate to a predetermined depth below the doped sacrificial first oxide layer, the diffusible atoms being present in the substrate; and
    a gate electrode, disposed above and insulated from a surface of the silicon substrate which has been subjected to the high temperature first anneal, where the gate electrode is coupled to drive circuitry for inducing a drift of minority charge carriers below said surface;

a source region disposed along a first side of a portion of the surface of the silicon substrate which has been subjected to the high temperature first anneal, where the source region is coupled to circuitry for inducing a drift of minority charge carriers below said portion of the surface; and a drain region disposed along an opposed second side of the portion of the surface of the silicon substrate which has been subjected to the high temperature first anneal, where the drain region is coupled to circuitry for inducing a drift of minority charge carriers below said portion of the surface;

wherein said gate electrode, source region and drain region define a transistor having a transconductance that is approximately 10% greater than a hypothetical transconductance that would have been obtained if said high temperature first anneal had not been performed with the doped sacrificial first oxide layer.

14. A semiconductor device comprising:

a monocrystalline silicon region comprising a top surface, the monocrystalline silicon region comprising a channel region of the semiconductor device;

two source or drain regions bordering on the monocrystalline silicon region, the source or drain regions bordering on the channel region; and a gate electrode adjacent to the top surface of the monocrystalline silicon region, for inducing changes in population of charge carriers in the monocrystalline silicon region;

wherein the monocrystalline silicon region comprises:

a plurality of first atoms each of which is an atom of chlorine, bromine, sulfur, fluorine, or phosphorus, the first atoms being present at a depth or depths greater than 0.1 µm below the top surface at which depth or depths the first atoms spread laterally continuously at least as far as the channel region; and a plurality of nitrogen atoms being present at a depth or depths greater than 0.1 µm below the top surface at which depth or depths the nitrogen atoms spread laterally continuously at least as far as the channel region.

15. The semiconductor device of claim 14 wherein the gate electrode is insulated from the channel region.

16. The semiconductor device of claim 14 wherein the first atoms are present at a depth or depths at least as great as 1 µm below the top surface at which depth or depths the first atoms spread laterally continuously at least as far as the channel region.

17. The semiconductor device of claim 14 wherein the nitrogen atoms are present at a depth or depths at least as great as 1 µm below the top surface at which depth or depths the nitrogen atoms spread laterally continuously at least as far as the channel region.

18. The semiconductor device of claim 14 wherein the first atoms are chlorine atoms.

19. A semiconductor device comprising:

a monocrystalline silicon region comprising a top surface, the monocrystalline silicon region comprising a channel region of the semiconductor device;

two source or drain regions bordering on the monocrystalline silicon region, the source or drain regions being at opposite ends of the channel region; and a gate electrode adjacent to the top surface of the monocrystalline silicon region, for inducing changes in population of charge carriers in the monocrystalline silicon region;

wherein the monocrystalline silicon region comprises:

a plurality of first atoms each of which is an atom of chlorine, bromine, sulfur, fluorine, or phosphorus, the first atoms being present at a depth or depths greater than 0.1 µm below the top surface at which depth or depths the first atoms spread laterally continuously between the two source or drain regions; and a plurality of nitrogen atoms being present at a depth or depths greater than 0.1 µm below the top surface at which depth or depths the nitrogen atoms spread laterally continuously between the two source or drain regions.

20. The semiconductor device of claim 19 wherein the gate electrode is insulated from the channel region.

21. The semiconductor device of claim 20 wherein the first atoms are present at a depth or depths at least as great as 1 µm below the top surface at which depth or depths the first atoms spread laterally continuously at least as far as the channel region.

22. The semiconductor device of claim 19 wherein the nitrogen atoms are present at a depth or depths at least as great as 1 µm below the top surface at which depth or depths the nitrogen atoms spread laterally continuously at least as far as the channel region.

23. The semiconductor device of claim 19 wherein the first atoms are chlorine atoms.

* * * * *